(12) United States Patent
Saunders

(10) Patent No.: US 10,426,062 B1
(45) Date of Patent: Sep. 24, 2019

(54) HIGH PRESSURE, ENERGY EFFICIENT DATA CENTER

(71) Applicant: Microsoft Technology Licensing, LLC, Redmond, WA (US)

(72) Inventor: Winston A. Saunders, Seattle, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 0 days.

(21) Appl. No.: 15/951,506

(22) Filed: Apr. 12, 2018

(51) Int. Cl.
  *H05K 7/20* (2006.01)
  *H05K 5/06* (2006.01)
  *H05K 7/14* (2006.01)

(52) U.S. Cl.
  CPC ......... *H05K 7/20745* (2013.01); *H05K 5/069* (2013.01); *H05K 7/1497* (2013.01); *H05K 7/2079* (2013.01); *H05K 7/2059* (2013.01)

(58) Field of Classification Search
  CPC .... H05K 7/2059; H05K 7/20745; H05K 5/06; H05K 5/069; H05K 7/1497
  USPC .......................................... 361/688–689, 691
  See application file for complete search history.

(56) References Cited

U.S. PATENT DOCUMENTS

| 6,167,947 B1 * | 1/2001 | Hokanson ............. F28D 1/0477 165/122 |
| 9,320,177 B2 * | 4/2016 | Levesque ........... H05K 7/20745 |
| 2010/0024445 A1 | 2/2010 | Cichanowicz |
| 2010/0149754 A1 | 6/2010 | Chapel et al. |
| 2014/0273792 A1 | 9/2014 | Kondo |
| 2015/0327406 A1 | 11/2015 | Gallefoss |
| 2017/0156239 A1 | 6/2017 | Meredith et al. |

OTHER PUBLICATIONS

Khalaj, et al., "A Review on efficient thermal management of air- and liquid-cooled data centers: From chip to the cooling system", In Journal of Applied Energy, vol. 205, Nov. 1, 2017, 3 Pages.

Rawson, et al., "Inert Gas Data Center Fire Protection and Hard Disk Drive Damage", In Journal of Data Center, Aug. 27, 2012, 18 Pages.

* cited by examiner

*Primary Examiner* — Zachary Pape

(74) *Attorney, Agent, or Firm* — Buckley, Maschoff & Talwalkar LLC

(57) ABSTRACT

According to some embodiments, a hermetically sealed container may have sides defining an interior portion that is able to hold gas at high pressure, such as at least substantially 2 times standard atmospheric pressure. One or more data center computer servers may be located within the interior portion and the high pressure may improve heat transfer for a data center. At least one side of the container may include a hermetically sealed electrical and/or optical feed-through providing an ability to connect the computer server to an element outside of the interior portion (e.g., a power source and/or another data center computer server) and a mechanism to remove heat from the container, such as a liquid loop heat exchanger, etc.

21 Claims, 13 Drawing Sheets

| ATMOSPHERE | AIR  302 | AIR  304 | $CO_2$  306 | $SF_6$  308 |
|---|---|---|---|---|
| PRESSURE | 1 | 2 | 2 | 2 |
| FAN POWER | 1 | 0.7 | 0.98 | 0.25 |
| HEAT TRANSPORT | 1 | 1.4 | 1.8 | 6.9 |

FIG. 3

| CONTAINER IDENTIFIER 1202 | PRESSURE 1204 | PURITY 1206 | TEMPERATURE 1208 | DOOR STATUS 1210 |
|---|---|---|---|---|
| C_1001 | 2.5 | 98% | 125°F | CLOSED |
| C_1002 | 2.3 | 100% | 120°F | CLOSED |
| C_1003 | 1 | N/A | 75°F | OPEN |
| C_1004 | 2.7 | 95% | 135°F | CLOSED |

HIGH PRESSURE, ENERGY EFFICIENT DATA CENTER

BACKGROUND

Data center equipment can generate substantial amounts of heat. For example, data center computer servers, server racks, etc. can generate a substantial amount of heat that needs to be removed to maintain temperatures within prescribed limits and ensure that the hardware will continue to function properly. This can be especially true when the data center utilizes high power servers (which generate heat in proportion to higher power). To help move the heat away from such devices, some data centers employ heat sinks and electric fans (which can consume a substantial amount of energy). In cases of higher power levels liquid cooling circuits and liquid immersion baths (which can be expensive and error-prone), more expensive heat sink solutions, etc. are required.

What is needed is a system to efficiently improve data center cooling without needing expensive additional hardware.

BRIEF DESCRIPTION OF THE DRAWINGS

FIG. 3 is a table illustrating potential results according to some embodiments.

FIG. 12 is tabular portion of a sensor database in accordance with some embodiments.

DETAILED DESCRIPTION

The following description is provided to enable any person in the art to make and use the described embodiments. Various modifications, however, will remain readily apparent to those in the art.

Generally, some embodiments provide systems and methods to efficiently improve data center cooling without needing expensive additional hardware. Note that data centers are continually pushing against the limits of thermal transfer away from servers due to the limited thermal conductivity and heat capacity of air. This has led to the development of expensive solutions, such as liquid-cooling, complicated heat-pipes, and other inventions, to address this shortfall in capability. Some embodiments described herein may resolve the thermal transfer problem without the use of additional hardware by enclosing data center servers in a high pressure atmosphere. This may improve thermal management and/or reduce server fan power considerably.

Figure 1:
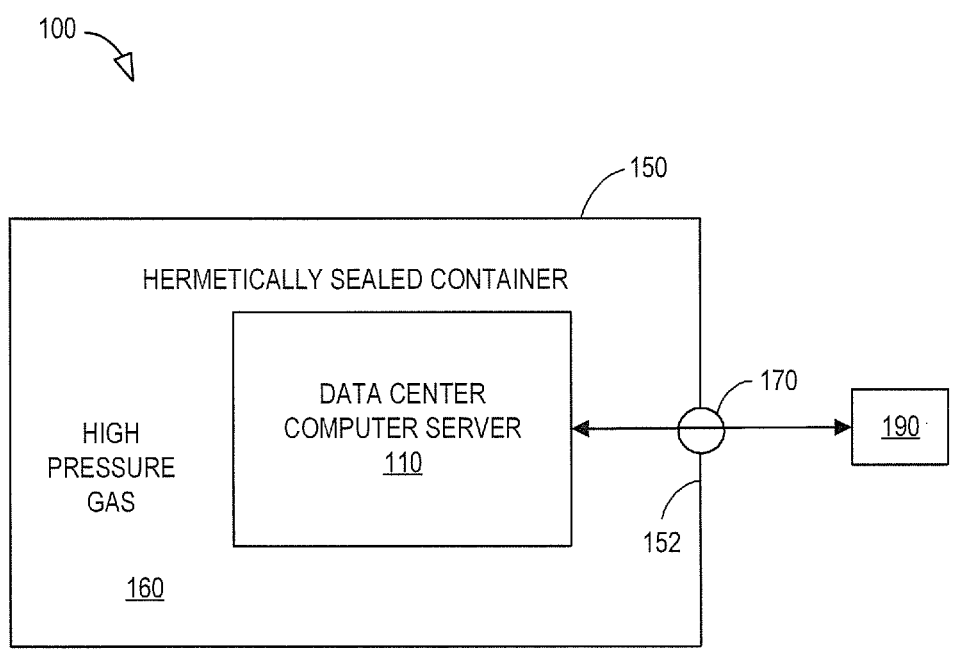
FIG. 1 is a high-level block diagram of a system according to some embodiments.

FIG. 1 is a high-level block diagram of a system 100 according to some embodiments. The system 100 includes a hermetically sealed container 150 having sides 152 defining an interior portion 160. The interior portion 160 may be able to hold gas at high pressure, such as at least substantially 2 times "standard pressure." Note that atmospheric pressure (also referred to as barometric pressure) is the pressure within the earth's atmosphere of Earth. Generally, atmospheric pressure can be approximated by the hydrostatic pressure caused by the weight of air above a measurement point. Thus, atmospheric pressure decreases as elevation increases (because there is less air above the measurement point). Measured at sea level, the "standard pressure" on earth is approximately 101325 Pascals ("Pa") or 14.7 pounds-per-square-inch ("psi").

The system 100 further includes a data center computer server 110 located within the interior portion 160. At least one side 152 of the container 150 includes a "hermetically sealed" electrical and/or optical feed-through 170 providing an ability to connect the computer server 110 to an element 190 outside of the interior portion 160. As used herein, the phrase "hermetically sealed" may refer to any seal that prevent the high pressure gas from escaping the container 150. Because the interior portion 160 contains high pressure gas, heat may be transferred from the data center computer server 110 more efficiently (that is, the air molecules are closer together and more easily able to transfer heat energy from one molecule to another).

Figure 2:
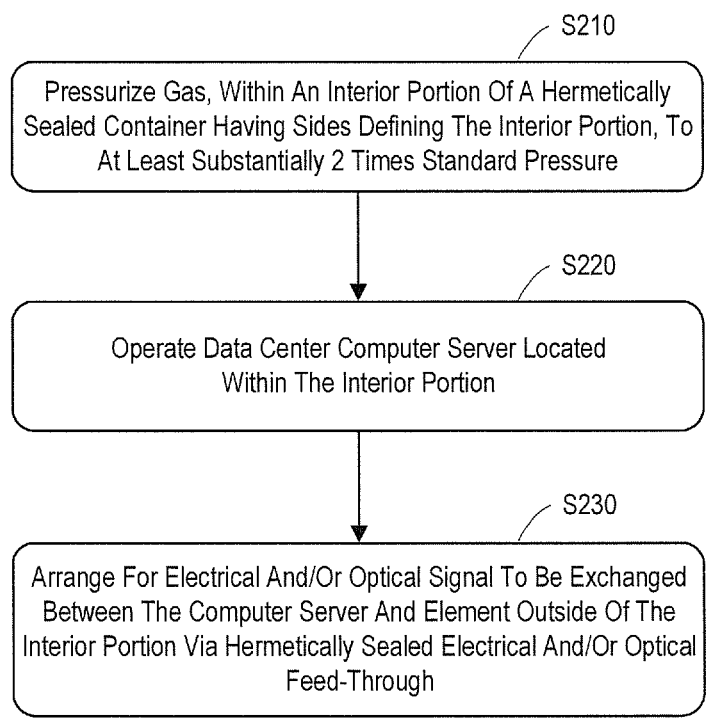
FIG. 2 is a flow diagram of a process to improve heat transfer for a data center in accordance with some embodiments.

FIG. 2 is a flow diagram of a process to improve heat transfer for a data center in accordance with some embodiments. At S210, gas is pressurized within an interior portion of a hermetically sealed container having sides defining the interior portion, to at least substantially 2 times standard pressure. The high pressure gas may comprise air (i.e., nitrogen ("$N_2$"), oxygen ("$O_2$"), Argon ("Ar"), carbon dioxide ($CO2$), etc.). According to other embodiments, the gas may comprise an inert atmosphere (e.g., to provide an additional benefit of fire suppression), such as, but not limited to, pure $N_2$, $CO_2$, sulfur hexafluoride ("SF6"), combinations thereof, etc. Note that the gas might be pressurized, according to some embodiments, from at least substantially 2 times standard pressure to substantially 5 times standard pressure.

At S220, a data center computer server located within the interior portion is operated (and generates heat). At S230, it may be arranged for an electrical and/or optical signal to be exchanged between the computer server and an element outside of the interior portion via a hermetically sealed electrical and/or optical feed-through. For example, a power source outside the container might provide electricity to run the computer server, the computer server might receive information and or transmit information via the feed-through, etc.

FIG. 3 is a table 300 illustrating potential results according to some embodiments. In particular, the table 300 includes four results associated with four different atmosphere/pressure combinations. The first result 302 illustrates air at standard pressure (i.e., "1" standard pressure). In this case, the amount for fan power used and the heat transfer ability of the gas are assigned values of "1" for comparison purposes. The second result 304 illustrates when happens when the air pressure within the container is doubled to "2"

standard pressures. As a result of the increased pressure, fan power decreased to 0.7 while the heat transfer ability of the air increased to 1.4. In the third example 306, air is replaced with $CO_2$ at 2 standard pressures. As a result, fan power became 0.98 while the heat transfer ability of the gas increased to 1.8. In the final example 308, $CO_2$ is replaced with $SF_6$ at 2 standard pressures. As a result, fan power became 0.25 while the heat transfer ability of the gas increased to 6.9.

Figure 4:
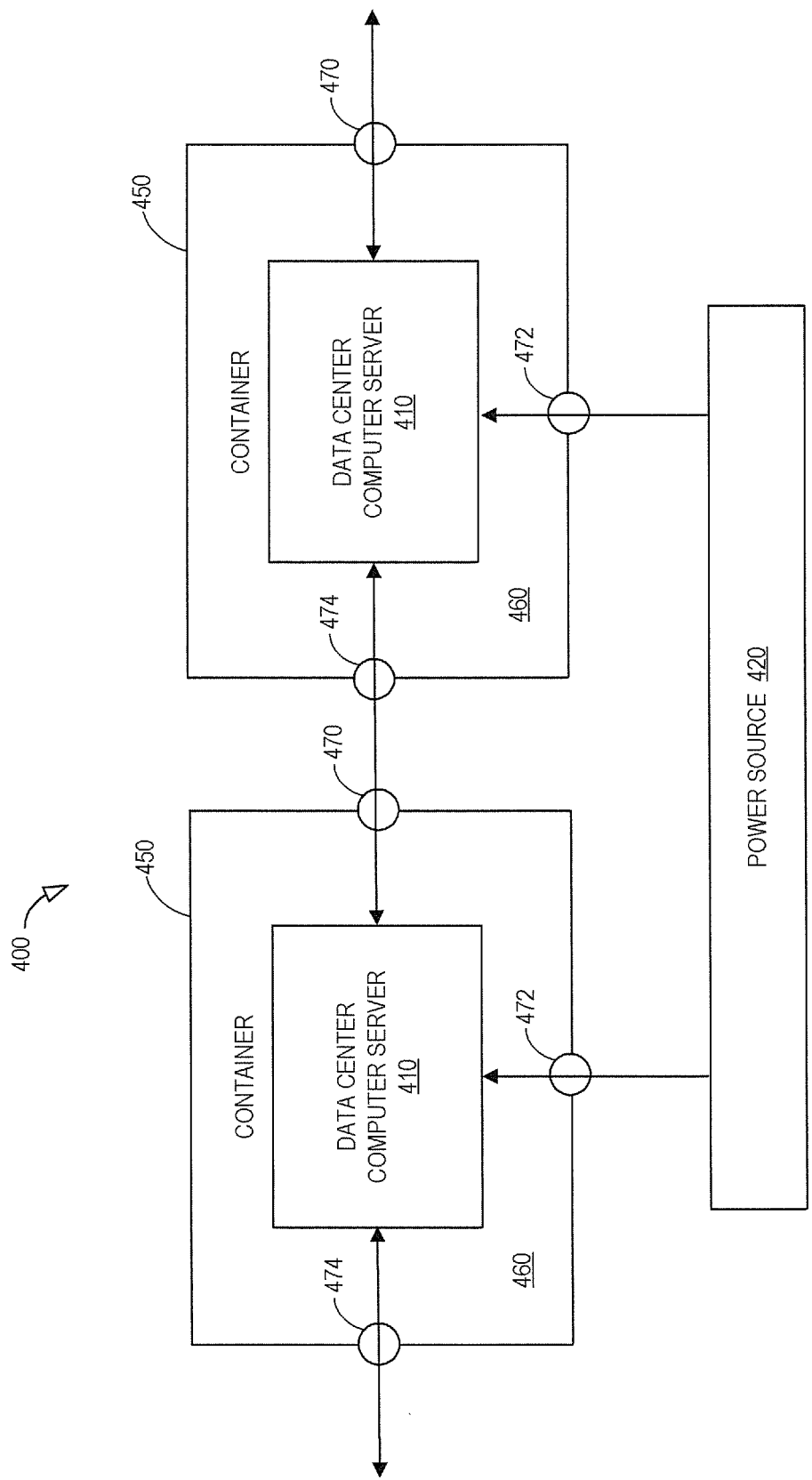
FIG. 4 illustrates multiple containers in accordance with some embodiments.

As mentioned with respect to FIG. 1, a data center computer server within a container may be connected via a feed-through to one or more external elements, such as an electrical power source, another data center computer server, etc. FIG. 4 illustrates 400 multiple containers 450 in accordance with some embodiments. As before, the system 400 includes hermetically sealed containers 450 each having an interior portion 460 able to hold gas at high pressure, such as at least substantially 2 times standard pressure. The system 400 further includes a data center computer server 410 located within each interior portion 460. At least one side of the container 450 includes a hermetically sealed electrical and/or optical feed-through 470 providing an ability to connect the computer server 410 to an element outside of the interior portion 460. In particular, feed-through 472 receives power from a power source 420 (e.g., to run the computer servers 410) while feed-throughs 470, 474 are utilized to exchange information with other computer servers 410. Note that a single container 450 may include multiple-feed throughs (three in the example of FIG. 4) in accordance with some embodiments. On other embodiment, a container might include only a single feed-through (and power and all communications might utilize that single feed-through).

Figure 5:
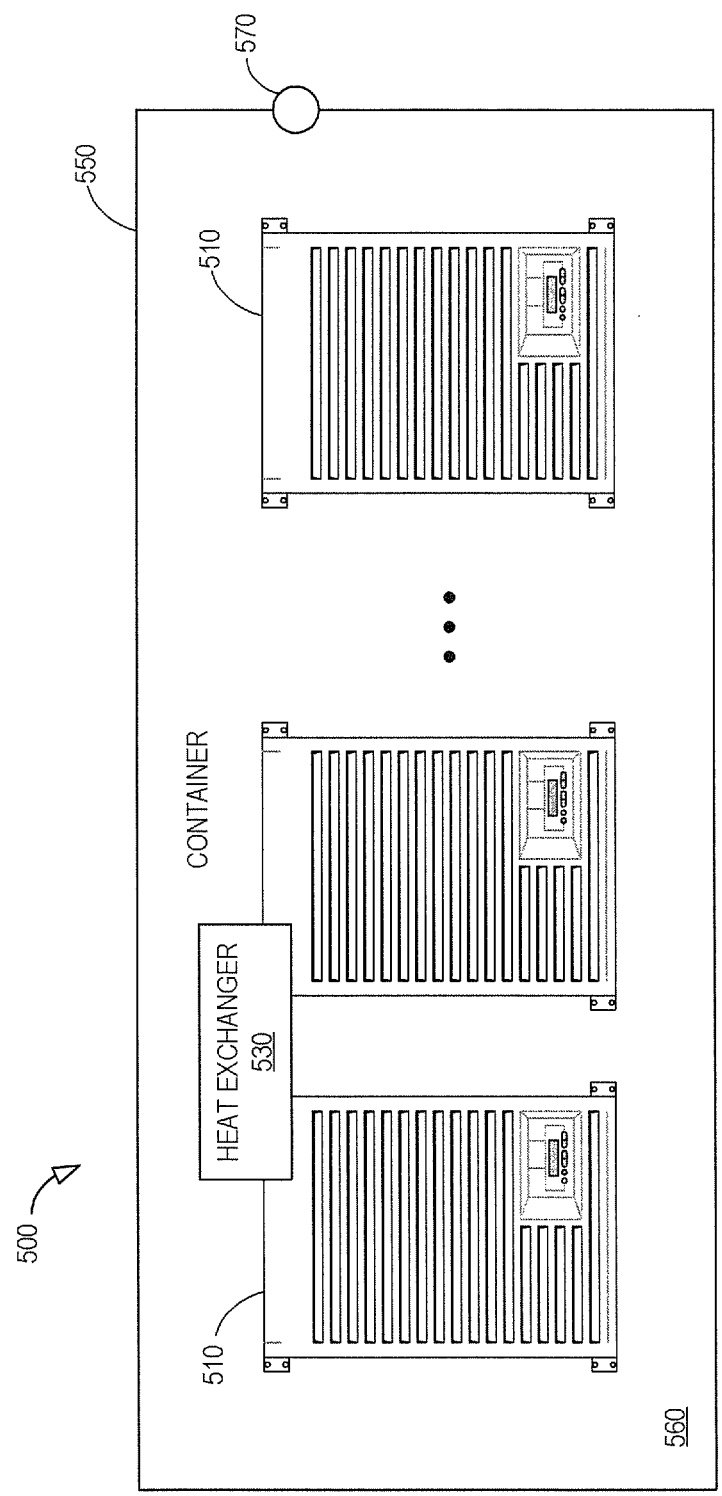
FIG. 5 illustrates a container for multiple data center computer server racks according to some embodiments.

In the example of FIG. 4, each computer server 410 is associated with its own container 450. According to other embodiments, plurality of data center computer servers might be located within the interior portion of a single container. For example, FIG. 5 illustrates 500 a container 550 for multiple data center computer server racks 610 according to some embodiments. As before, the system 500 includes a hermetically sealed container 550 having an interior portion 560 able to hold gas at high pressure, such as at least substantially 2 times standard pressure. The system 500 further includes multiple data center computer server racks 510 (e.g., each associated with many computer servers) located within the interior portion 560. At least one side of the container 550 includes a hermetically sealed electrical and/or optical feed-through 570 providing an ability to connect the computer server racks 510 to an element outside of the interior portion 560. According to this embodiment, a heat exchanger element 530 may be associated with multiple data center computer server racks 510 and may also be located within the interior portion 540. The heat exchanger element 530 might include, for example, a fan, a liquid cooling loop,) a heat sink, etc. The heat exchanger element 530 may be used to facilitate the transfer of heat away from the data center computer server racks 510 (e.g., via the high pressure gas within the interior portion 560 of the container 550), maintaining the temperature of the pressurized environment.

Because the container holds high pressure gas, in some cases a pressure control unit may help automatically and/or manually monitor and adjust the pressure. For example, FIG. 6 introduces a pressure control unit 640 for a container 650 in accordance with some embodiments. As before, the system 600 includes the hermetically sealed container 650 having an interior portion 660 able to hold gas at high pressure, such as at least substantially 2 times standard pressure. The system 600 further includes multiple data center computer server racks 610 (e.g., each associated with many computer servers) located within the interior portion 660. At least one side of the container 650 includes a hermetically sealed electrical and/or optical feed-through 670 providing an ability to connect the computer server racks 610 to an element outside of the interior portion 660. According to this embodiment, the pressure control unit 640 may monitor the pressure within the interior portion 660 (e.g., via one or more sensor placed within the container 650). The pressure control unit 640 might also adjust the pressure as appropriate (e.g., by forcing additional gas into the interior portion 660 or remove some gas from the interior portion 660).

Figure 6:
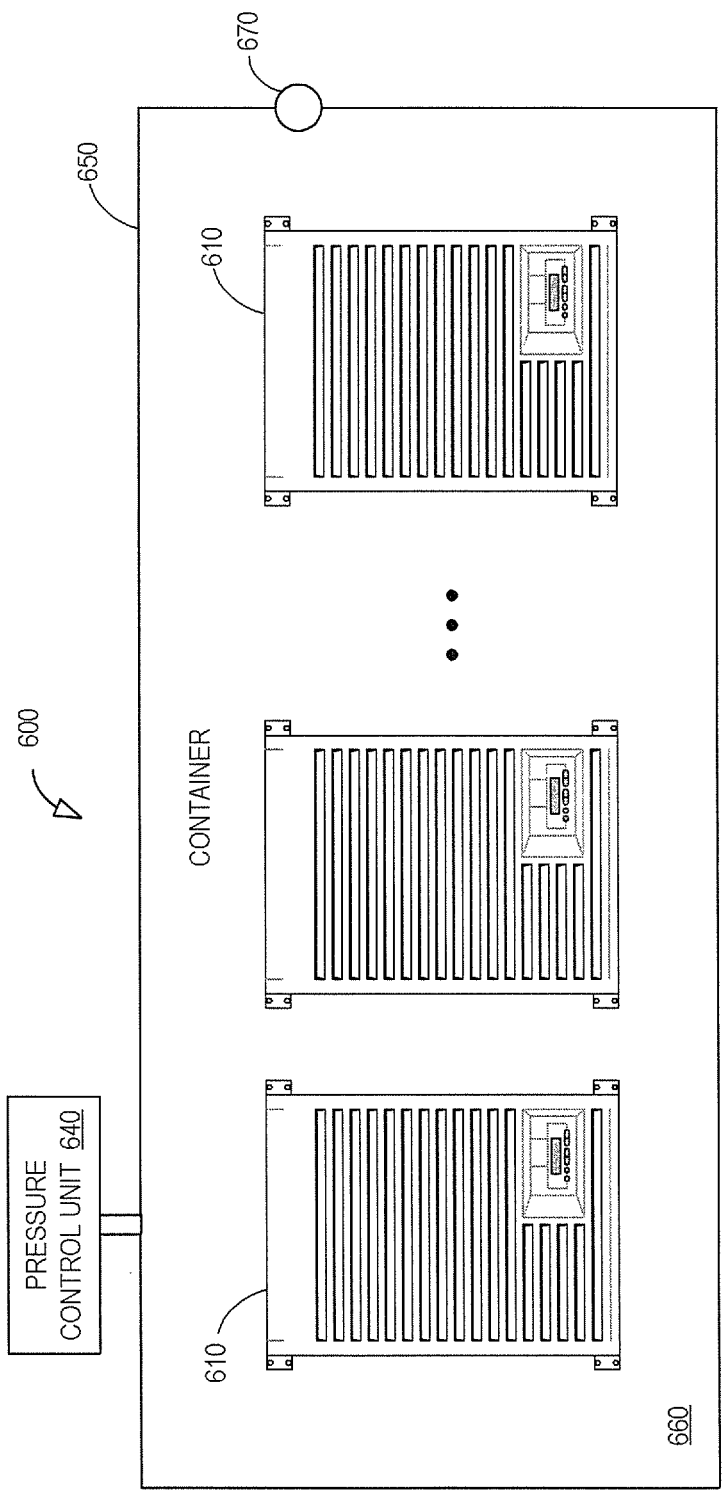
FIG. 6 introduces a pressure control unit for a container in accordance with some embodiments.
Figure 7:
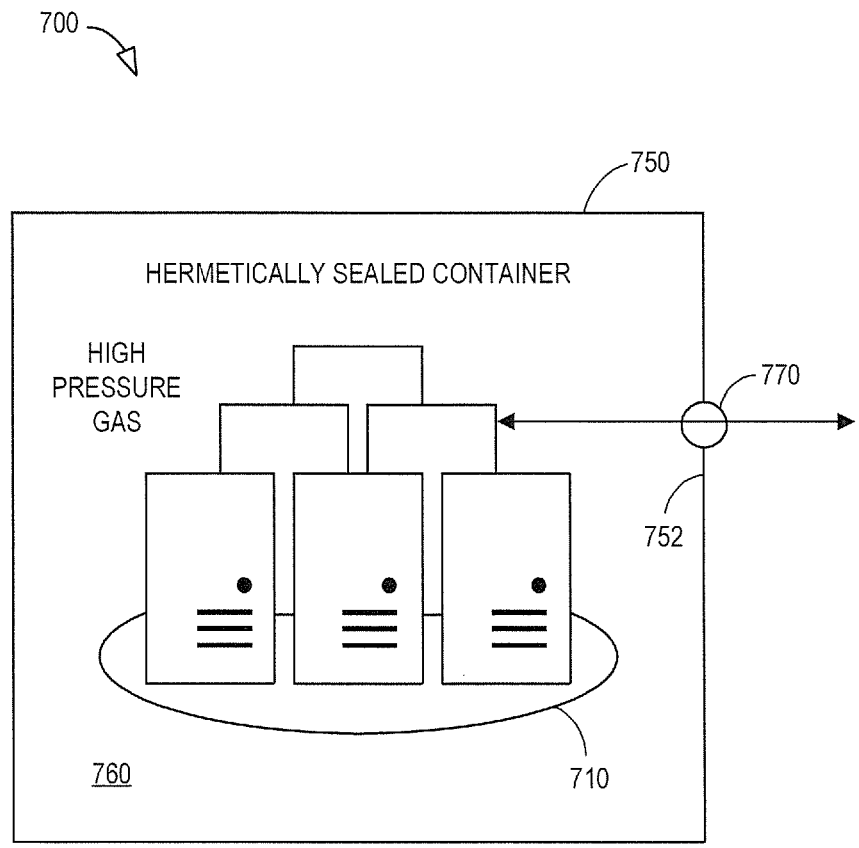
FIG. 7 illustrates a container for an entire data center according to some embodiments.

In the example of FIGS. 5 and 6, a single container housed multiple server racks (each having multiple computer servers). According to some embodiments, an entire data center might be located within an interior portion of a single container. For example, FIG. 7 illustrates a container 750 for an entire data center 710 according to some embodiments. As before, the system 700 includes the hermetically sealed container 750 having an interior portion 760 able to hold gas at high pressure, such as at least substantially 2 times standard pressure. The system 700 further includes the entire data center 710 (e.g., associated with a substantial number of computer servers) located within the interior portion 760. At least one side 752 of the container 750 includes a hermetically sealed electrical and/or optical feed-through 770 providing an ability to connect the data center 710 to an element outside of the interior portion 760. Note that according to some embodiments, a heat exchanger of some may be utilized remove heat from the pressurized vessel.

Figure 8:
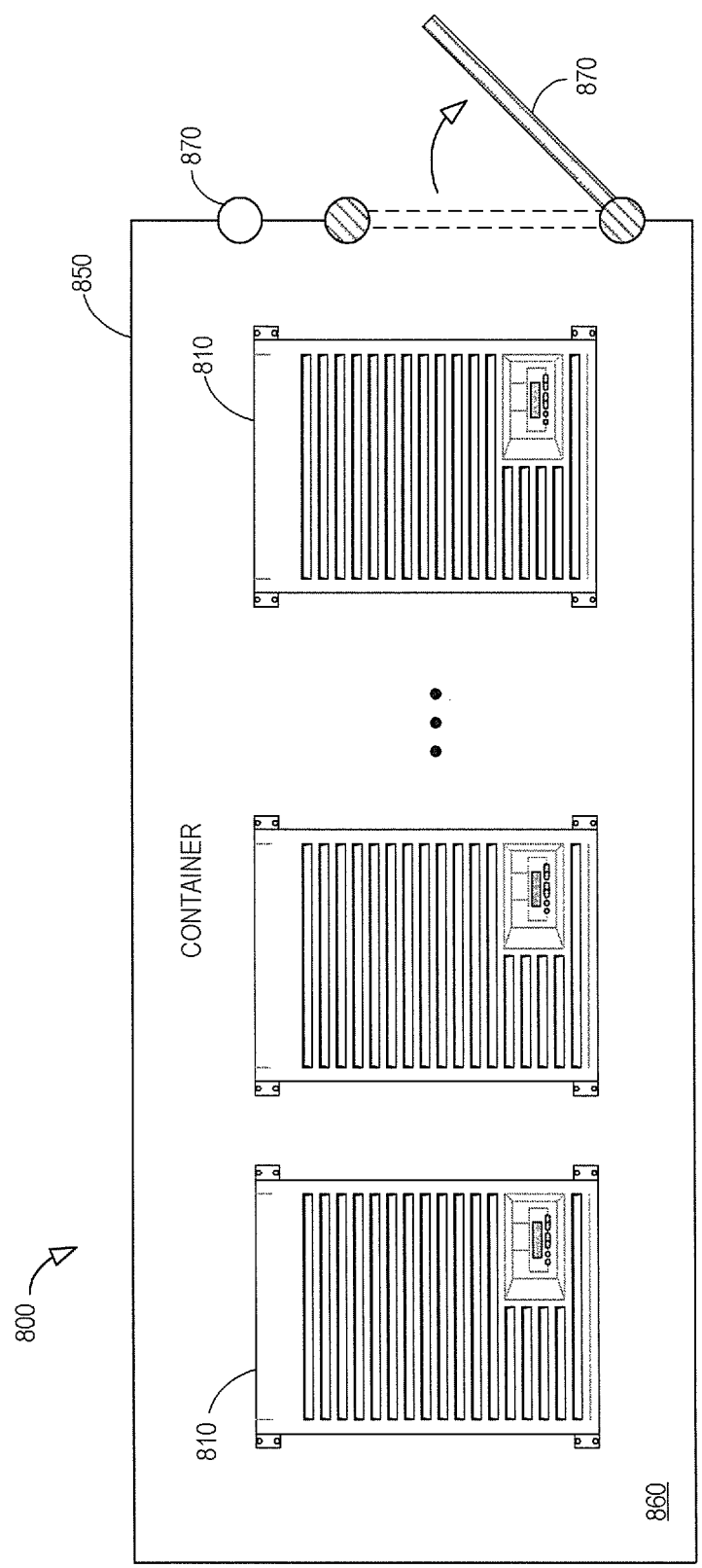
FIG. 8 introduces a human access safety door for a container in accordance with some embodiments.

Because a container may house computer equipment that periodically needs human attention (e.g., maintenance, inspection, etc.), according to some embodiments a human access safety door may provide an ability to access the equipment (e.g., a data center computer server). For example, FIG. 8 introduces a human access safety door 870 for a container 850 in accordance with some embodiments. As before, the system 800 includes the hermetically sealed container 850 having an interior portion 860 able to hold gas at high pressure, such as at least substantially 2 times standard pressure. The system 800 further includes multiple data center computer server racks 810 (e.g., each associated with many computer servers) located within the interior portion 860. At least one side of the container 850 includes a hermetically sealed electrical and/or optical feed-through 870 providing an ability to connect the computer server racks 810 to an element outside of the interior portion 860. According to this embodiment, the human access safety door 870 may be opened to let a person access the computer server racks 810. When he or she is finished, the human access safety door 870 may be closed and hermetically sealed.

Figure 9:
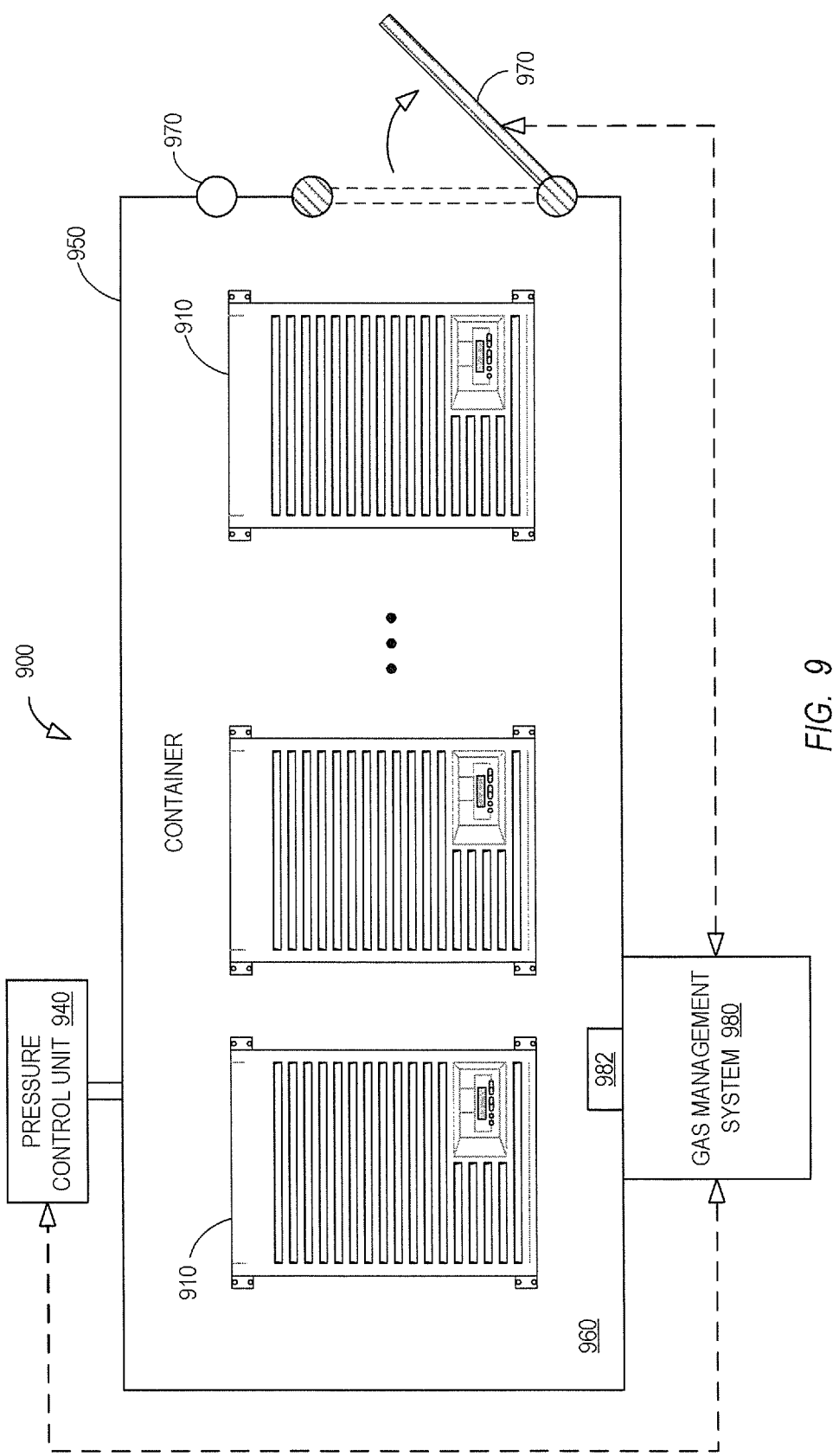
FIG. 9 illustrates a gas management system for a container according to some embodiments.

Note that the gas within the container 850 might not be safe to breathe, and inter-locks and other devices may be used to help ensure that such gases are safely removed from the interior portion 860 before entry is allowed. For example, FIG. 9 illustrates a gas management system 980 for a container 950 according to some embodiments. As before, the system 900 includes the hermetically sealed container 950 having an interior portion 960 able to hold gas at high pressure, such as at least substantially 2 times standard pressure. The system 900 further includes multiple data center computer server racks 910 (e.g., each associated with many computer servers) located within the interior portion 960. At least one side of the container 950 includes a hermetically sealed electrical and/or optical feed-through 970 providing an ability to connect the computer server racks 910 to an element outside of the interior portion 960, and a human access safety door 970 may be opened to let a person access the computer server racks 910. According to this embodiment, the gas management system 980 may be coupled to one or more sensors 982 within the container 950 (e.g., Micro-Electrical-Mechanical System "MEMS" devices to measure pressure), a pressure control unit 940 (described with respect to FIG. 6), and/or the human access safety door 970 (described with respect to FIG. 8).

Figure 10:
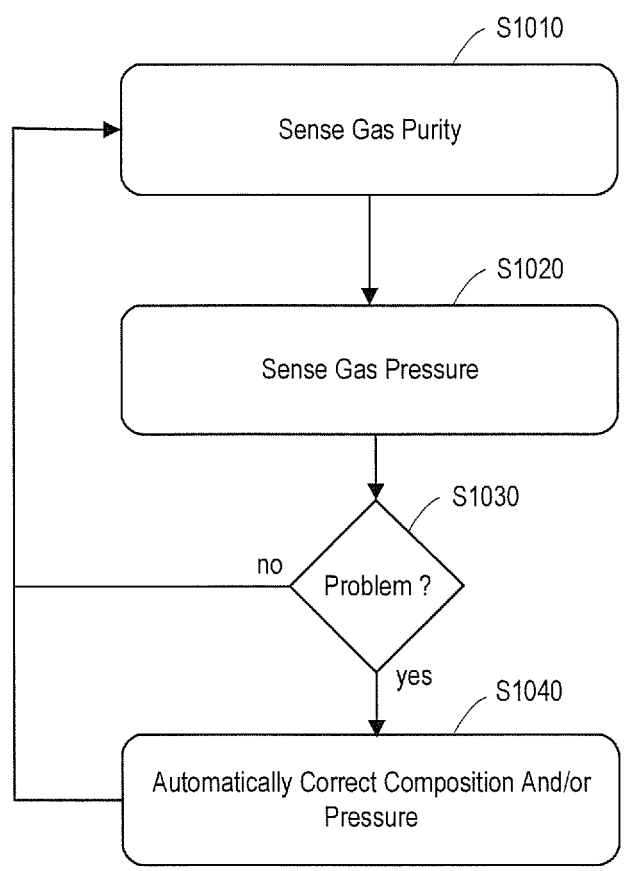
FIG. 10 is a gas management system method in accordance with some embodiments.

The gas management system 980 might, according to some embodiments, automatically perform pressure sensing (is the pressure too low or too high?), gas composition sensing (how pure is the gas?), pressure control (to increase or decrease the pressure), gas composition control (to adjust the composition), and/or control of the human access safety door 970 (e.g., to ensure operator safety). For example, FIG. 10 is a gas management system method in accordance with some embodiments. At S1010, the gas management system might sense gas purity. At S1020, the gas management system might sense gas pressure. If no problem is detected at S1030, the process continues at S1010. If a problem is detected at S1030, the gas management system may "automatically" correct the composition and/or pressure of the gas at S1040. As used herein, the term "automatically" may refer to actions taken with little or no human intervention.

Figure 11:
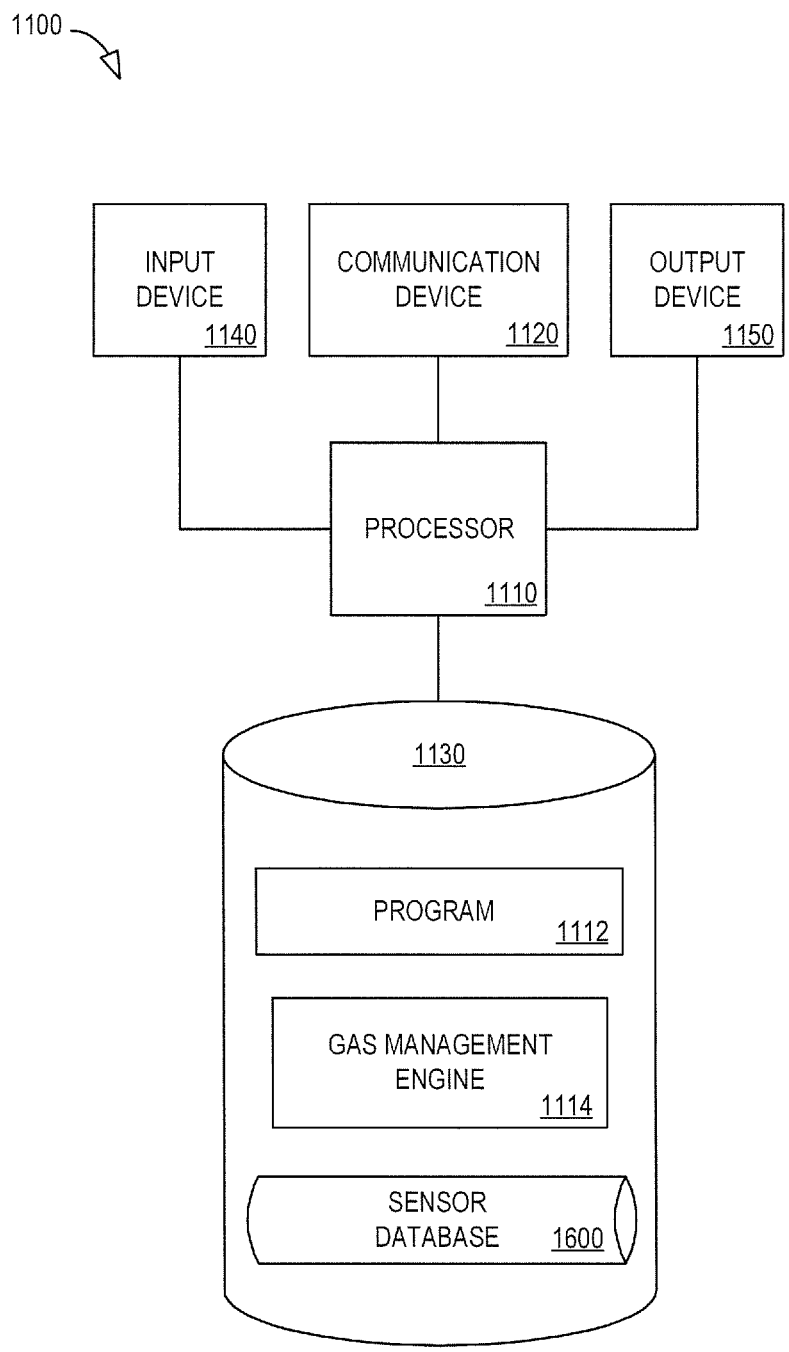
FIG. 11 illustrates a gas management system apparatus according to some embodiments.

The embodiments described herein may be implemented using any number of different hardware configurations. For example, FIG. 11 is a block diagram of a gas management system apparatus or platform 1100 that may be, for example, associated with the system 900 of FIG. 9 or any other system described herein. The gas management system 1100 comprises a processor 1110, such as one or more commercially available Central Processing Units ("CPUs") in the form of one-chip microprocessors, coupled to a communication device 1160 configured to communicate via a communication network (not shown in FIG. 11). The communication device 1160 may be used to communicate, for example, with one or more remote pressure control units, human access safety doors, etc. The gas management system 1100 further includes an input device 1140 (e.g., a computer mouse and/or keyboard to input data center information) and/an output device 1150 (e.g., a computer monitor to render a display, provide alerts, transmit recommendations, and/or create reports). According to some embodiments, a mobile device, monitoring physical system, and/or PC may be used by an operator to exchange information with the gas management system 1100.

The processor 1110 also communicates with a storage device 1130. The storage device 1130 may comprise any appropriate information storage device, including combinations of magnetic storage devices (e.g., a hard disk drive), optical storage devices, mobile telephones, and/or semiconductor memory devices. The storage device 1130 stores a program 1116 and/or a gas management engine 1114 for controlling the processor 1110. The processor 1110 performs instructions of the programs 1116, 1114, and thereby operates in accordance with any of the embodiments described herein. For example, the processor 1110 may automatically perform pressure sensing (has a threshold limit been reached?), gas composition sensing (is there too much $CO_2$?), pressure control (based, in some embodiments, on system use or thermal measurements), gas composition control, and/or control of a human access safety door.

The programs 1116, 1114 may be stored in a compressed, uncompiled and/or encrypted format. The programs 1116, 1114 may furthermore include other program elements, such as an operating system, clipboard application, a database management system, and/or device drivers used by the processor 1110 to interface with peripheral devices.

As used herein, information may be "received" by or "transmitted" to, for example: (i) the gas management system 1100 from another device; or (ii) a software application or module within the gas management system 1100 from another software application, module, or any other source.

In some embodiments (such as the one shown in FIG. 11), the storage device 1130 further stores a sensor database 1200. An example of a database that may be used in connection with the gas management system 1100 will now be described in detail with respect to FIG. 12. Note that the database described herein is only one example, and additional and/or different information may be stored therein. Moreover, various databases might be split or combined in accordance with any of the embodiments described herein.

Referring to FIG. 12, a table is shown that represents the sensor database 1200 that may be stored at the gas management system 1100 according to some embodiments. The table may include, for example, entries identifying data center containers being monitored. The table may also define fields 1202, 1204, 1206, 1208, 1210 for each of the entries. The fields 1202, 1204, 1206, 1208, 1210 may, according to some embodiments, specify: a container identifier 1202, a pressure 1204, a purity 1206, a temperature 1208, and a door status 1210. The sensor database 1200 may be created and updated, for example, based on information periodically received from sensors, pressure control units, human access safety doors, etc.

The container identifier 1202 might be a unique alphanumeric code associated with a particular high pressure container at a data center. The pressure 1204 (e.g., in terms of relation to standard pressure), purity 1206 (e.g., as compared to an ideal composition), and temperature 1208 may reflect current conditions inside the container. The door status 1210 might indicate whether a human access safety door is currently "open" or "closed" (e.g., to help ensure safety). For example, the pressure 1204 of container "C 1003" is currently "1" (standard pressure) because the door status is "open."

Figure 13:
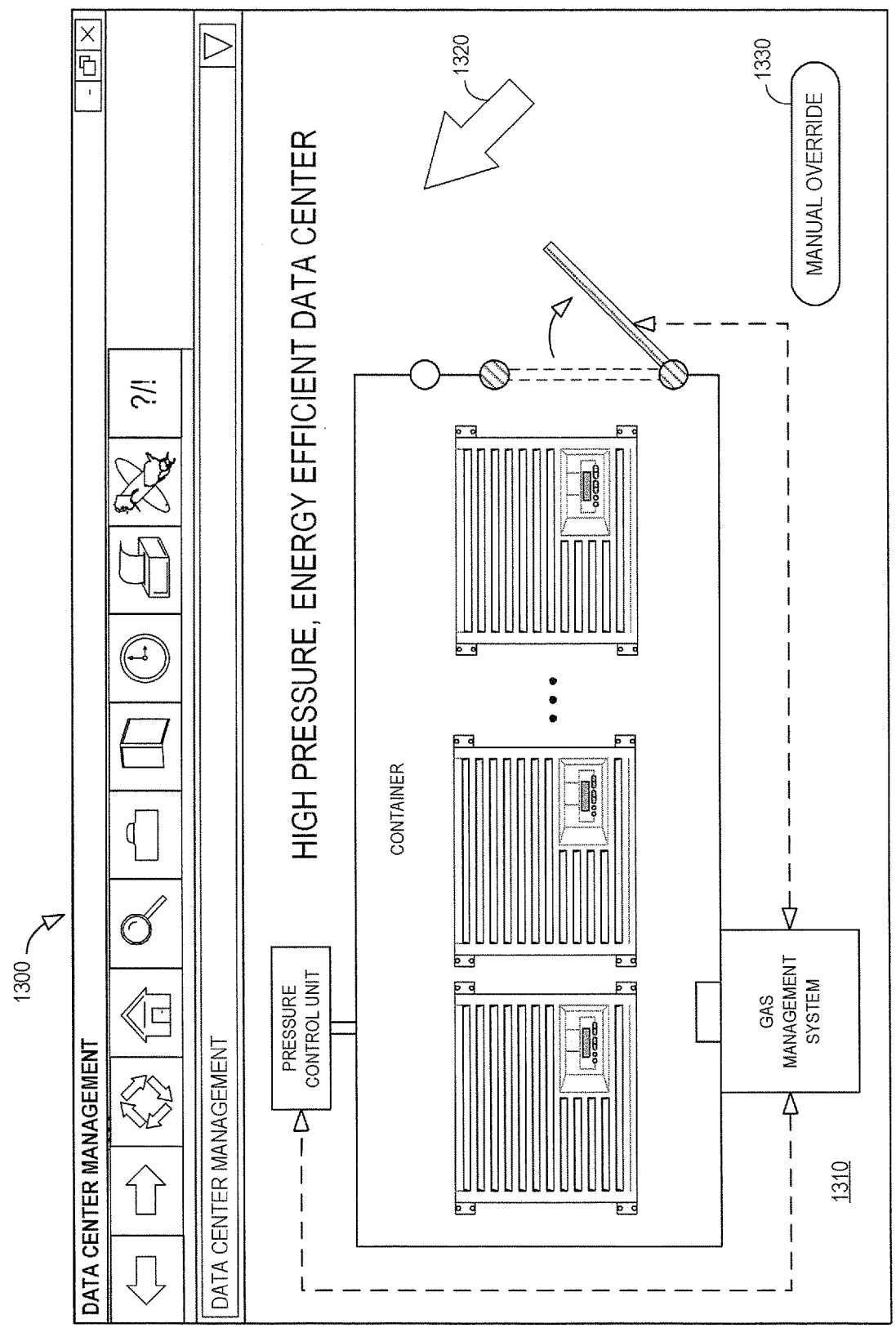
FIG. 13 is an example of a high pressure, energy efficient data center display according to some embodiments.

An operator might manage and/or monitor the performance of data center containers. For example, FIG. 13 is an example of a high pressure, energy efficient data center display 1300 according to some embodiments. The display 1300 includes graphical depictions 1310 of elements of a data center container. According to some embodiments, selection of an element via a touchscreen or computer mouse pointer 1320 may result in addition information being provided about that element (e.g., in a pop-up window) and/or let an operator adjust parameters for that element. Moreover, in some embodiments, selection of a "Manual Override" icon 1330 may let an operator shutdown or otherwise alter the automatic determination of a gas management system.

Thus, embodiments may provide systems and methods to efficiently improve data center cooling without the need of expensive additional hardware (such as those associated with a liquid cooling system). Note that higher power servers may demand greater cooling capacity as compared to what can be provided economically by simple air based cooling with fans and heat sinks. Some embodiments described herein may address that problem by modifying the ambient atmosphere around the server in the data center to higher pressure air and/or non-air atmospheres. Such an approach may improve heat transfer and improve efficiency in a novel way.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions.

Embodiments described herein are solely for the purpose of illustration. Those in the art will recognize other embodiments may be practiced with modifications and alterations to that described above.

What is claimed is:

1. A system to improve heat transfer for a data center, comprising:
    a hermetically sealed container having sides defining an interior portion that is able to hold gas at high pressure that is at least substantially 2 times standard pressure;
    a data center computer server located within the interior portion; and
    a management system configured to sense a purity of the pressurized gas within the interior portion and adjust a composition of the pressurized gas within the interior portion based on the sensed purity,
    wherein at least one side of the container includes a hermetically sealed electrical and/or optical feed-through providing an ability to connect the computer server to an element outside of the interior portion.

2. The system of claim 1, wherein the gas comprises at least one of: (i) air, (ii) carbon dioxide, (iii) nitrogen, (iv) sulfur hexafluoride, and (v) an inert atmosphere.

3. The system of claim 2, wherein the high pressure is greater than substantially 2 times standard pressure and less than or equal to substantially 5 times standard pressure.

4. The system of claim 1, wherein a plurality of data center computer servers are located within the interior portion and share access to the hermetically sealed electrical and/or optical feed-through.

5. The system of claim 4, wherein a plurality of data center computer server racks are located within the interior portion and share access to the hermetically sealed electrical and/or optical feed-through.

6. The system of claim 5, further comprising:
    a heat exchanger element, associated with multiple data center computer server racks, located within the interior portion.

7. The system of claim 6, wherein the heat exchanger element comprises at least one of: (i) a fan, (ii) a liquid cooling loop, and (iii) a heat sink.

8. The system of claim 5, wherein the entire data center is located within the interior portion.

9. The system of claim 1, wherein the container includes a plurality of hermetically sealed electrical and/or optical feed-throughs.

10. The system of claim 1, wherein at least one side of the container further includes:
    a human access safety door providing an ability to access the data center computer server.

11. The system of claim 1, wherein the management system is configured to automatically perform at least one of: (i) pressure sensing, (ii) gas composition sensing, (iii) pressure control, (iv) gas composition control, and (v) control of a human access safety door.

12. The system of claim 1, wherein the element outside of the interior portion is associated with another data center computer server.

13. A method to improve heat transfer for a data center, comprising:
    pressurizing gas, within an interior portion of a hermetically sealed container having sides defining the interior portion, to at least substantially 2 times standard pressure;
    operating a data center computer server located within the interior portion;
    sensing a purity of the pressurized gas within the interior portion and adjusting a composition of the pressurized gas within the interior portion based on the sensed purity; and
    arranging for an electrical and/or optical signal to be exchanged between the computer server and an element outside of the interior portion via a hermetically sealed electrical and/or optical feed-through.

14. The method of claim 13, wherein the gas comprises at least one of: (i) air, (ii) carbon dioxide, (iii) nitrogen, (iv) sulfur hexafluoride, and (v) an inert atmosphere.

15. The method of claim 14, wherein the high pressure is greater than substantially 2 times standard pressure and less than or equal to substantially 5 times standard pressure.

16. The method of claim 13, wherein a plurality of data center computer servers are located within the interior portion and share access to the hermetically sealed electrical and/or optical feed-through.

17. The method of claim 13, further comprising:
    automatically performing, by a gas management system computer processor at least one of: (i) pressure sensing, (ii) gas composition sensing, (iii) pressure control, (iv) gas composition control, and (v) control of a human access safety door.

18. The method of claim 13, wherein the element outside of the interior portion is associated with another data center computer server.

19. A system to improve heat transfer for a data center, comprising:
    a hermetically sealed container having sides defining an interior portion that is able to hold gas at high pressure that is between substantially 2 times standard pressure and substantially 5 times standard pressure;
    a plurality of data center computer server racks located within the interior portion, wherein at least one side of the container includes a hermetically sealed electrical and/or optical feed-through providing an ability to connect the computer server to an element outside of the interior portion;
    a management system configured to sense a purity of the pressurized gas within the interior portion and adjust a composition of the pressurized gas within the interior portion based on the sensed purity;
    a heat exchanger element, associated with multiple data center computer server racks, located within the interior portion; and
    a human access safety door providing an ability to access the data center computer server.

20. The system of claim 19, wherein the gas management system is configured to automatically perform: (i) pressure sensing, (ii) gas composition sensing, (iii) pressure control, (iv) gas composition control, and (v) control of the human access safety door.

21. The system of claim 1, wherein the system comprises a plurality of hermetically sealed containers that each include one or more computer servers held therein, and the management system controls pressure and purity for each of the respective hermetically selected containers based on limits stored and/or accessible to the management system.

* * * * *